US006437557B1

(12) United States Patent
Smith

(10) Patent No.: US 6,437,557 B1
(45) Date of Patent: Aug. 20, 2002

(54) PC CARD CLAMPING DEVICE FOR AUTOMATED TEST FIXTURE

(75) Inventor: Lonnie W. Smith, Round Rock, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/487,132

(22) Filed: Jan. 19, 2000

(51) Int. Cl.[7] ............................................. G01R 31/02
(52) U.S. Cl. ..................... 324/158.1; 324/755; 439/67
(58) Field of Search ................................ 324/754, 755, 324/758, 765, 158.1; 439/65, 67, 372, 498, 77, 55, 495

(56) References Cited

U.S. PATENT DOCUMENTS

| 4,357,575 A | | 11/1982 | Uren et al. | |
| 4,922,191 A | * | 5/1990 | Conover | 324/755 |
| 4,975,068 A | * | 12/1990 | Squires | 439/67 |
| 5,160,269 A | * | 11/1992 | Fox, Jr. et al. | 439/67 |
| 5,485,096 A | | 1/1996 | Aksu | |
| 5,698,990 A | | 12/1997 | Aussant | |
| 5,711,628 A | * | 1/1998 | Fletcher | 403/31 |
| 6,017,244 A | * | 1/2000 | Daane | 439/495 |

* cited by examiner

Primary Examiner—Michael Sherry
Assistant Examiner—Minh N. Tang
(74) Attorney, Agent, or Firm—Haynes and Boone, LLP

(57) ABSTRACT

An adjustable clamp for testing PC cards includes a base member having a planar surface and raised guides spaced apart to define a plurality of slots. A clamp member includes a plurality of spaced apart ribs seated for lateral movement in the slots. A fastener, which is removable, extends through the base member and the clamp member. The fastener is adjustable for moving the ribs laterally in the slots and retaining the clamp member on the base member. In this manner, a plurality of PC cards are retained between the raised guides and the ribs and maintained in a straightened configuration for insertion into respective circuit board connectors during testing of the circuit board.

14 Claims, 3 Drawing Sheets

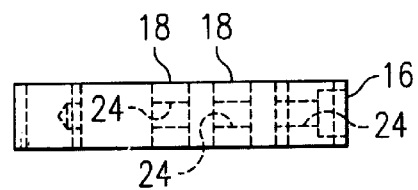
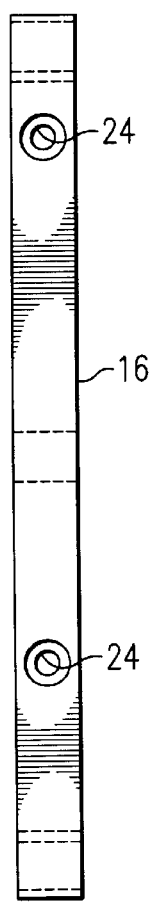
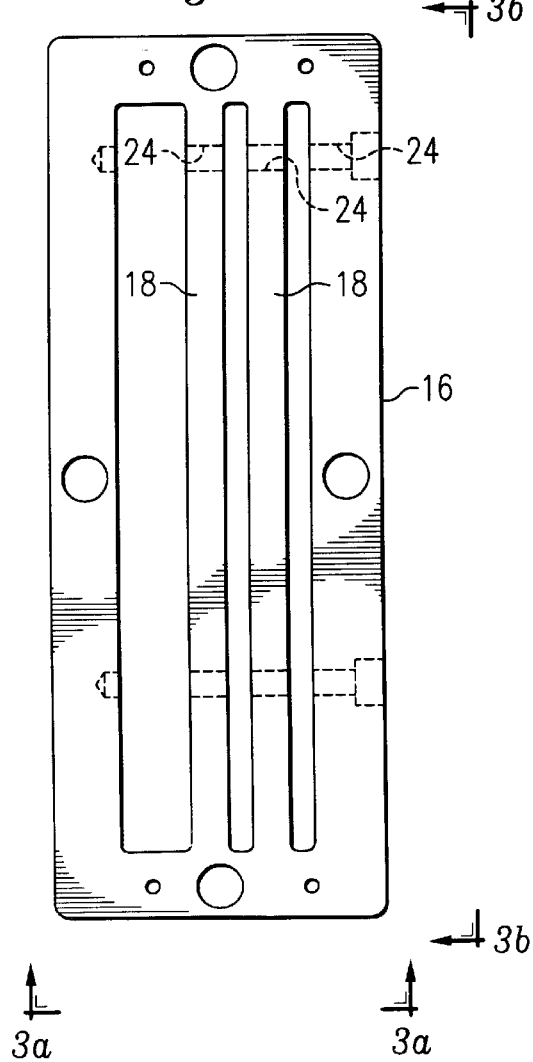

PC CARD CLAMPING DEVICE FOR AUTOMATED TEST FIXTURE

BACKGROUND

The disclosures herein relate generally to computer systems and more particularly to assembly of modules during the manufacture of computer systems.

Manual insertion of dual inline memory modules (DIMMS) by a test operator for the purpose of functionally testing motherboards has proven in the past to cause extensive damage to the motherboards and the DIMMS resulting in increased costs to manufacturers. One prior method to address this problem was to install the DIMMS onto an interface card located beneath the motherboard and connect the DIMMS by means of electrical traces and test probes.

Another prior method was to install a "sacrifice" or "throw away" board between the DIMMS and the motherboard thereby increasing the life span of the DIMMS. This solution does not address the damage incurred to the motherboards during test. Due to the greater bus speeds encountered on more current DIMMS and RAMBUS inline memory modules (RIMMS) the above-mentioned method will no longer suffice.

In U.S. Pat. No. 4,357,575, a testing fixture apparatus for use in accurately effecting temporary electrical connections with the test point zones of printed circuit boards or the like is provided. The board to be tested is mounted upon a locator assembly that is receivable within the fixture, and includes a centering and gripping mechanism for automatically positioning the locator assembly and printed circuit board in a predetermined location within the fixture. This assures precise alignment of a contact with each of the test point zones of the printed circuit board to be tested. The positioning action of the mechanism and its cooperating part includes both a centering function and a gripping function therebetween. Both of these functions occur automatically in response to relative shifting of the portions of the fixture for respectively supporting the printed circuit board and the contacts toward each other into an operative relationship, for effecting electrical connections between the test point zones of the printed circuit board and corresponding contacts of the fixture.

In U.S. Pat. No. 5,485,096, there is disclosed a printed circuit board test apparatus which has a test bed formed by a planar member having a plurality of through channels at close spacing across its surface to receive test probes. Each of the test probes comprises a tubular body having a top contact surface and a socket at its opposite end. A plurality of planar switch cards are provided with each card for supporting, along one edge thereof, a plurality of pins which are disposed in rows at locations corresponding to the predetermined locations of the through channels of the test board. Each switch card has a plurality of electrical circuits which interconnect with selected pins and which are connected to selected contacts of a connector located at another extremity of the switch card. The switch cards are supported with the ends of the pins received in recesses of the test probes, thereby establishing conductive paths from the surface contacts of the probes to the connector of the card. Each switch card is connected to the remainder of the test circuitry of the test equipment. Preferably, components such as switching circuits are mounted on the switch cards to control the test functions of the test equipment.

In U.S. Pat. No. 5,698,990, a counterforce spring assembly for printed circuit board test fixtures is provided. A number of counterforce spring assemblies are provided in an array between the top plate and probe plate of the test fixture. Each counterforce spring assembly includes a support cup residing in an aperture through the probe plate. A compression spring resides in the support cup and provides spring-biasing of the top plate to the probe plate during the testing cycle of the unit under test (UUT). Each counterforce spring assembly includes a circumferential flange to limit downward travel of the top plate toward the probe plate. Each assembly is small enough to fit between probe apertures corresponding to component leads of the UUT. The counterforce spring assemblies can be freely placed underneath the top plate to provide even spring-biasing thereof to prevent bowing and bending of the top plate, which often causes errors in the testing of printed circuit boards.

Therefore, what is needed is a PC card clamping device for an automated test fixture which maintains the card or cards straight and aligned for automatic insertion into mating connectors provided on a UUT.

SUMMARY

One embodiment, accordingly, provides a clamping device formed of two plates which are adjustable to retain and straighten the PC cards for use in a test fixture. To this end, a PC card clamping apparatus includes a base member having a plurality of slots formed therein. A clamp member includes a plurality of ribs formed therein seated for lateral movement in the slots. A fastener, which is removable, extends through the base member and the clamp member. The fastener is adjustable for moving the ribs laterally in the slots and retaining the clamp member on the base member.

A principal advantage of this embodiment is that the PC card is retained in a straightened manner so that bowing of the card does not occur. Another advantage is that multiple cards may be retained in parallel and in alignment with their respective connectors.

BRIEF DESCRIPTION OF THE DRAWING FIGURES

FIG. 3 is a planar view illustrating an embodiment of a clamp member of the PC card clamping apparatus.

FIG. 3a is a view taken along line 3a—3a of FIG. 3.

FIG. 3b is a view taken along line 3b—3b of FIG. 3.

DETAILED DESCRIPTION

Figure 1A:
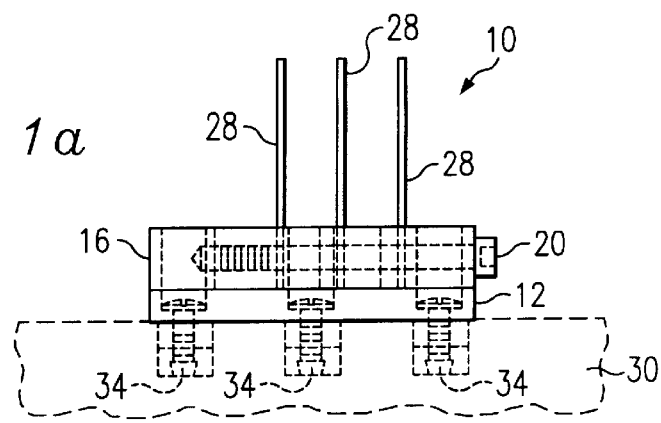
FIG. 1a is a view taken along line 1a—1a of FIG. 1.
Figure 1B:
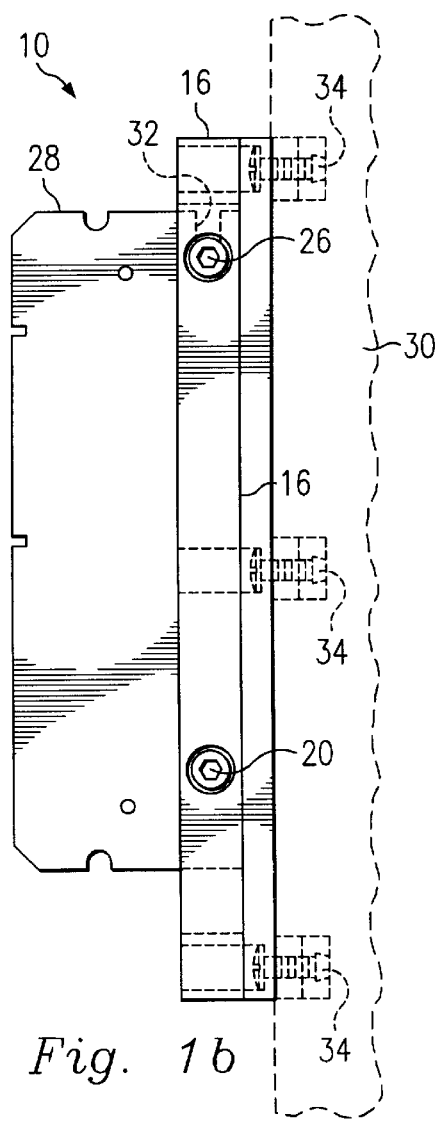
FIG. 1b is a view taken along line 1b—1b of FIG. 1.
Figure 1:
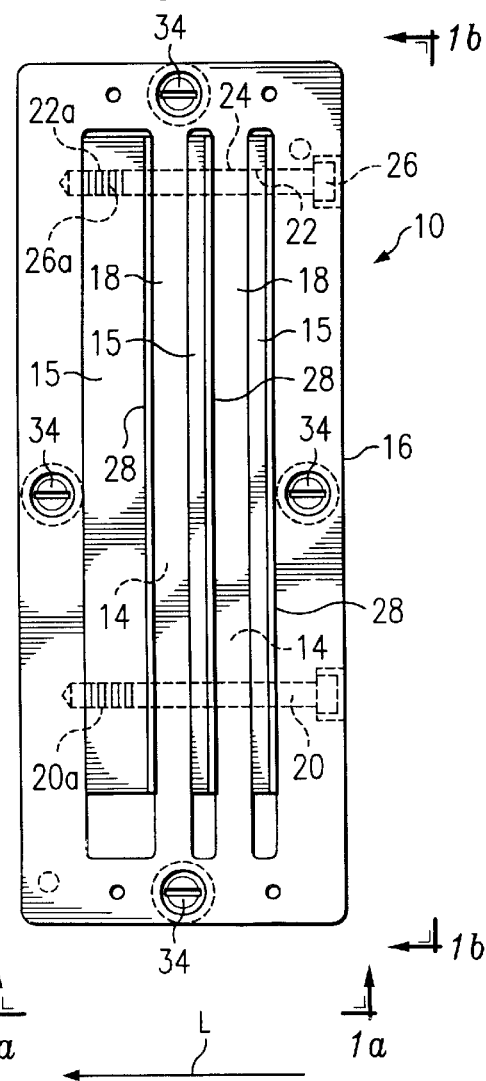
FIG. 1 is a planar view illustrating an embodiment of a PC card clamping apparatus.

A PC card clamping apparatus 10 is illustrated in FIGS. 1, 1a and 1b, and includes a base member 12 having a plurality of slots 14 formed therein. A clamp member 16 has a plurality of ribs 18 formed therein seated for lateral movement in the slots 14. A fastener 20 is adjustable for moving the ribs 18 laterally in the slots 14 and retaining the clamp member 16 on the base member 12.

Figure 2A:
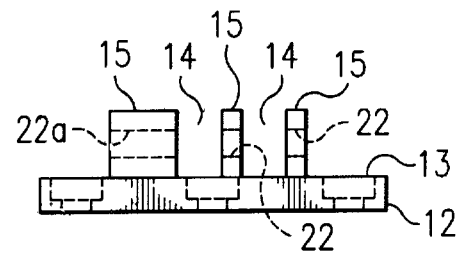
FIG. 2a is a view taken along line 2a—2a of FIG. 2.
Figure 2B:
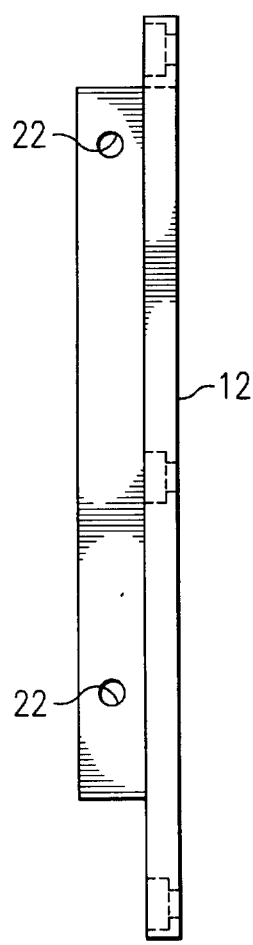
FIG. 2b is a view taken along line 2b—2b of FIG. 2.
Figure 2:
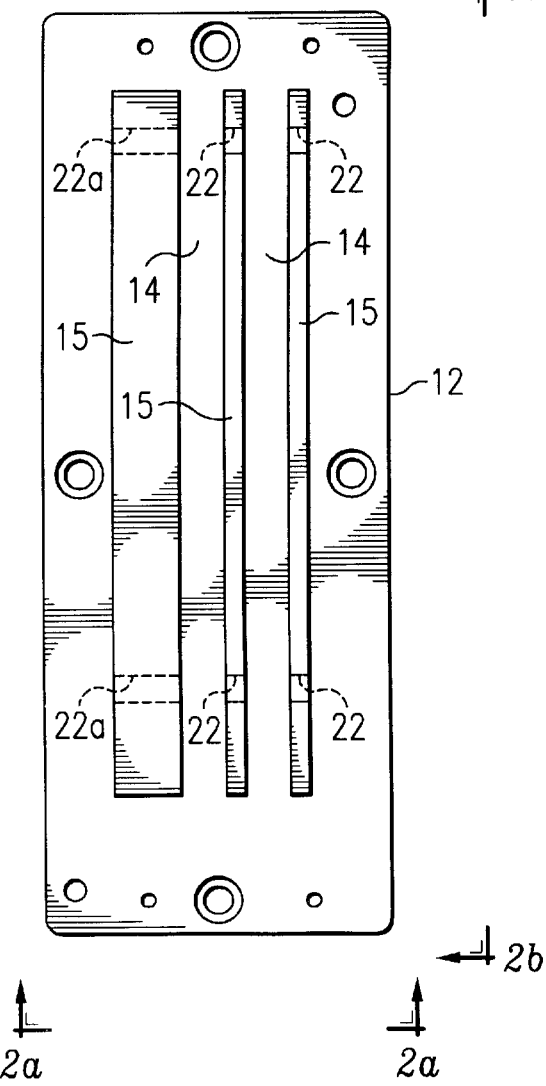
FIG. 2 is a planar view illustrating an embodiment of a base member of the PC card clamping apparatus.

The slots 14, FIGS. 2, 2a, 2b, extend substantially parallel along the base member 12 and the ribs 18, FIGS. 3, 3a, 3b, extend substantially parallel along the clamp member 16 so as to permit the ribs 18 to nest in the slots 14, see FIGS. 1, 1a. A first plurality of aligned apertures 22, FIG. 2, are formed in the base member 12 for receiving the fastener 20. Also, at least one of the first apertures 22a is threaded. The fastener 20 includes a threaded end 20a, FIG. 1, for engagement with the threaded aperture 22a. An additional or second plurality of aligned apertures 24, FIGS. 3, 3a, 3b, are formed in the clamp member 16 for alignment with the first apertures 22 when the ribs 18 are nested in the slots 14. In this manner, the fastener 20, FIG. 1, is engageable with the aligned first 22 and second 24 apertures. A supplemental fastener 26 may be included to stabilize the seating of the clamp member 16 on the base member 12. The supplemental fastener 26 also has a threaded end 26a for engagement with the threaded aperture 22a.

The clamping apparatus 10, FIGS. 1, 1a, 1b, is adjustable for testing PC cards 28 in a test fixture 30, only partially illustrated in FIGS. 1a, 1b. The base member 12, FIG. 2a, includes a planar surface 13 having a plurality of raised guides 15 spaced apart to define the slots 14 therebetween. When the clamp 16 is seated on the base 12, the raised guides 15 are received in a plurality of channels 17 formed in clamp 16. The clamp member ribs 18, FIG. 3a, are spaced apart to seat in the slots 14, FIG. 2a, and are laterally movable in the slots 14. The fastener members 20, 26, FIG. 1, removably extend through the guides 15 in the base member 12 and through the ribs 18 in the clamp member 16. The fasteners 20, 26 are adjustable in the threaded apertures 22a for moving the ribs 18 laterally in the slots 14 toward the guides 15 in the direction indicated by the arrow designated L, and for retaining the clamp member 16 on the base member 12.

The first plurality of aligned apertures 22, FIG. 2, are formed in the raised guides 15 of the base member 12. The second plurality of aligned apertures 24, FIG. 3, are formed in the ribs 18 for alignment with the first apertures 22 in the guides 15, see FIG. 3. In this manner, the fasteners 20, 26, FIG. 1, are engageable with the first and second apertures 22, 24, respectively. The threaded apertures 22a receive the threaded end 20a, 26a of the fasteners 20, 26, respectively, for maintaining the seated or nested engagement of the ribs 18 in the slots 14. The raised guides 15 provide a fixed reference for each PC card 28 so that cumulative tolerance build-up is avoided. This retains the cards 28 on center for proper alignment with well-known board mounted connectors (not shown) provided for connection with cards 28.

The PC card 28 is clamped in the test fixture 30 by providing a slot 14 in the base member 12. The clamp member 16 is provided with rib 18 to be seated in the slot 14. The rib 18 is undersized relative to the slot 14 to allow the rib 18 to move laterally in the slot 14. The PC card 28 may be inserted in the slot 14 adjacent to the rib 18. The fastener members 20, 26 may be inserted through the base member 12, the clamp member 16 and the PC card 28. By adjusting the fastener members 20, 26 to move the rib 18 laterally in the slot 14, the PC card 28 may be clamped in the slot 14 by engagement with the rib 18.

In a similar manner, a plurality of PC cards 28 may be clamped in the test fixture 30 by providing the base member 12 having the raised guides 15 spaced apart to define the slots 14 therebetween. The clamp member 16 includes the ribs 18 each seated in a respective slot 14. The ribs 18 are undersized to allow for lateral movement of each rib 18 in each slot 14. The PC cards 28 may be inserted in each slot 14 adjacent to a rib 18. The fastener members 20, 26 are inserted through each guide 15, each rib 18 and each PC card 28. By adjusting the fastening members 20, 26, each rib 18 is simultaneously moved laterally in its respective slot 14, in the direction indicated by arrow L, to clamp each PC card 28 between a rib 18 and a guide member 15.

By providing a plurality of attachment members 34, FIGS. 1, 1a, 1b, mounted in the base member 12, the PC card clamping apparatus 10 may be attached to the test fixture 30. The attachment members 34 may be a commercially available faster which has the capability for quick attachment and release. Cards 28, FIG. 1b, may including a lost 32 for engaging faster 26 so that only one faster 26 requires removal to release cards 28.

As a result, one embodiment provides a PC card clamping apparatus including a base member having a plurality of slots formed therein. A clamp member has a plurality of ribs formed therein seated for lateral movement in the slots. A fastener is adjustable for moving the ribs laterally in the slots and retaining the clamp member on the base member.

Another embodiment provides an adjustable clamp for testing PC cards. The clamp includes a base member including a planar surface and a plurality of raised guides spaced apart to define a plurality of slots therebetween. A clamp member includes a plurality of spaced apart ribs seated in the slots and laterally movable therein. A fastener removably extends through the base member and the clamp member. The fastener is adjustable for moving the ribs laterally in the slots and retaining the clamp member on the base member.

A further embodiment provides a method of clamping a PC card in a test fixture. A base member is formed having a slot therein. A clamp member is formed to include a rib therein seated for lateral movement in the slot. A PC card is inserted in the slot adjacent the rib. A fastening member is inserted through the base member, the rib and the PC card. The fastening member is adjustable for moving the rib laterally in the slot and clamping the PC card in the slot.

A still further embodiment provides a method of clamping a plurality of PC cards in a test fixture. A base member is formed having a plurality raised guides spaced apart to define a plurality of slots therebetween. A clamp member is formed having a plurality of ribs therein respectively seated for lateral movement in the slots. A PC card is inserted in each slot adjacent the respective rib. A fastening member is inserted through each guide, each rib and each PC card. The fastening member is adjusted for moving the ribs laterally in the respective slots and clamping the PC cards in the respective slots.

As it can be seen, the principal advantages of these embodiment are that the PC card is retained in a straightened configuration so that bowing of the card does not occur. Multiple cards may be retained in parallel and in alignment with their respective connectors. The cards are quickly interchangeable and the ability to maintain the boards in a straightened configuration, avoids uneven wear on the connectors. An extended portion on each side is clamped into the fixture. Also, a fixed reference on the edge of each slot avoids cumulative tolerance buildup and retains the cards on center for proper alignment with the board mounted connectors.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A PC card clamping apparatus comprising:
   a base member having a plurality of aligned and parallel slots formed therein and a plurality of aligned apertures extending through the base and transversing the parallel slots;

a clamp member having a plurality of aligned and parallel ribs formed therein and a plurality of aligned apertures transversing the parallel ribs, the clamp member being mounted on the base member such that the ribs are loosely seated in the slots and the apertures of the ribs are aligned with the apertures of the base for lateral movement in the slots; and a fastener extending transversely through the aligned apertures in the base member and clamp member and being adjustable for simultaneously and equidistantly moving the ribs laterally in the slots and retaining the clamp member on the base member.

2. The clamping apparatus as defined in claim 1 further including a plurality of attachment members mounted in the base member for attaching the apparatus to a test fixture.

3. The clamping apparatus as defined in claim 1 wherein the apertures in the base member include a threaded aperture and the fastener includes a threaded end for engagement with the threaded aperture.

4. The clamping apparatus as defined in claim 1 further including a supplemental fastener.

5. An adjustable clamp for testing PC cards comprising:

a base member including a planar surface and a plurality of aligned and parallel raised guides spaced apart to define a plurality of slots therebetween;

a clamp member including a plurality aligned and parallel of spaced apart ribs seated in the slots and laterally movable therein; and a fastener removably extending through the base member and the clamp member, the fastener being adjustable for simultaneously and equidistantly moving the ribs laterally in the slots and retaining the clamp member on the base member.

6. The adjustable clamp as defined in claim 5 wherein each slot is substantially parallel to each other slot.

7. The adjustable clamp as defined in claim 6 wherein each rib is substantially parallel to each other rib.

8. The adjustable clamp as defined in claim 5 further including a first plurality of aligned apertures formed in the raised guides.

9. The adjustable clamp as defined in claim 8 further including a second plurality of aligned apertures formed in the ribs for alignment with the first apertures, whereby the fastener is engageable with the aligned first and second apertures.

10. The adjustable clamp as defined in claim 9 wherein the first apertures include a threaded aperture and the fastener includes a threaded end for engagement with the threaded aperture.

11. The adjustable clamp as defined in claim 10 further including a supplemental fastener.

12. A method of clamping a plurality of PC cards in a test fixture comprising:

forming a base member having a plurality of aligned and parallel raised guides spaced apart to define a plurality of slots therebetween;

forming a clamp member having a plurality of aligned and parallel spaced apart ribs;

mounting the clamp member on the base member so that the ribs are loosely seated in the slots for lateral movement in the slots;

inserting a PC card in each slot adjacent the respective rib;

forming alignable apertures in the base member, the ribs and the PC cards for receiving a fastening member;

inserting the fastening member through the aligned aperture of each guide, each rib and each PC card; and adjusting the fastening member for simultaneously and equidistantly moving the ribs laterally in the respective slots and clamping the PC cards in the respective slots so that each card is aligned and parallel with each other card and the cards are clamped between a raised guide and a respective rib.

13. The method as defined in claim 12 wherein forming alignable apertures includes forming a threaded aperture in the base member.

14. The method as defined in claim 13 wherein adjusting the fastening member includes engaging a threaded end of the fastening member with the threaded aperture.

* * * * *